United States Patent [19]
Lilly

[11] Patent Number: 6,128,589
[45] Date of Patent: *Oct. 3, 2000

[54] METHOD AND APPARATUS FOR MODELLING A SYSTEM WHICH INCLUDES THE TRANSMISSION AND RECEPTION OF SIGNALS

[75] Inventor: Andrew Stuart Lilly, Sawbridgeworth, United Kingdom

[73] Assignee: Nortel Networks Limited, Montreal, Canada

[ * ] Notice: This patent issued on a continued prosecution application filed under 37 CFR 1.53(d), and is subject to the twenty year patent term provisions of 35 U.S.C. 154(a)(2).

[21] Appl. No.: 08/882,453

[22] Filed: Jun. 26, 1997

[51] Int. Cl.$^7$ .............................. G06F 17/50; G06G 7/62
[52] U.S. Cl. .................................. 703/13; 703/2; 703/23
[58] Field of Search ............................. 395/500, 500.43, 395/500.44, 500.23; 364/578; 345/326; 703/2, 13, 23

[56] References Cited

U.S. PATENT DOCUMENTS

| | | | |
|---|---|---|---|
| 5,151,984 | 9/1992 | Newman et al. | 395/500.43 |
| 5,335,339 | 8/1994 | Maejima et al. | 395/500 |
| 5,561,841 | 10/1996 | Markus | 455/446 |
| 5,566,295 | 10/1996 | Cypher et al. | 345/326 |
| 5,826,065 | 10/1998 | Hinsberg, III et al. | 395/500.43 |
| 5,946,474 | 8/1999 | Skogby | 395/500.44 |

OTHER PUBLICATIONS

Wales, "An Object Oriented Approach to Radio Link Simulation," IEE Colloquium on Communications Simulation and Modelling Techniques, pp. 1–9, 1993.
"Tesellations", The Technical Newsletter from Tessella, Edition 16, Spring 1994.
"Tesellations", News and Technical Updates from Tessella, Edition 19, Spring 1995.

*Primary Examiner*—Kevin J. Teska
*Assistant Examiner*—Samuel Broda
*Attorney, Agent, or Firm*—Lee, Mann, Smith, McWilliams, Sweeney & Ohlson

[57] ABSTRACT

A method of modelling a system which includes the transmission and reception of a signal, said method comprising the steps of:
(i) creating a number of blocks, each block comprising a piece of program code and each block being a representation of an aspect of the system, wherein each block has a pre-defined output; and (ii) forming connections between the blocks, each connection comprising a bus for transferring data between blocks, wherein each bus has the same pre-defined format such that in use blocks can be connected in different configurations without redefining the block outputs.

18 Claims, 19 Drawing Sheets

| Function | Parameter | Value |
|---|---|---|
| Simulation | Sampling rate<br>Run length | 1.0 MHz<br>10,000 samples |
| Transmitter | Centre frequency<br>PRF<br>Pulse length | 3.0 GHz<br>15.0 kHz<br>10.0 µs |
| Transmit antenna | Start azimuth, elevation<br>End azimuth, elevation<br>Sweep time<br>Peak main lobe gain<br>Polarisation | 0.0°, 11.09°<br>12.0°, 11.09°<br>10 ms<br>30 dB<br>Horizontal |
| Jammer | Output power<br>Type | 30 dBW (over radar BW) |
| Sea clutter | Map, range cells<br>Map, azimuth cells<br>Type<br>Spike density<br>Spike decay rate<br>Spike decorrelation normalisation<br>Spike peak level<br>Spike minimum level threshold<br>Bin decorrelation factor<br>Diffraction factor | 18 cells from 1 km to 10 km<br>9 cells from 0° to 13.5°<br>K Distribution<br>2.0 km$^{-2}$<br>2.0 s$^{-1}$<br>log(1.0)-log(0.01)<br>100.0<br>3.0<br>log(1.0)-log(0.1)<br>1.362 |
| Receive antenna | As Transmit antenna, except:<br>Receiver Noise<br>Maximum AA null depth<br>AA null width<br>AA update interval<br>Maximum number of AA nulls | <br>3 dB<br>30 dB<br>2°<br>1 ms<br>2 |
| CFAR | Map, range cells<br>Map, azimuth cells | 18 cells from 1 km to 10 km<br>10 cells from 0° to 5.0° |

*Fig. 10*

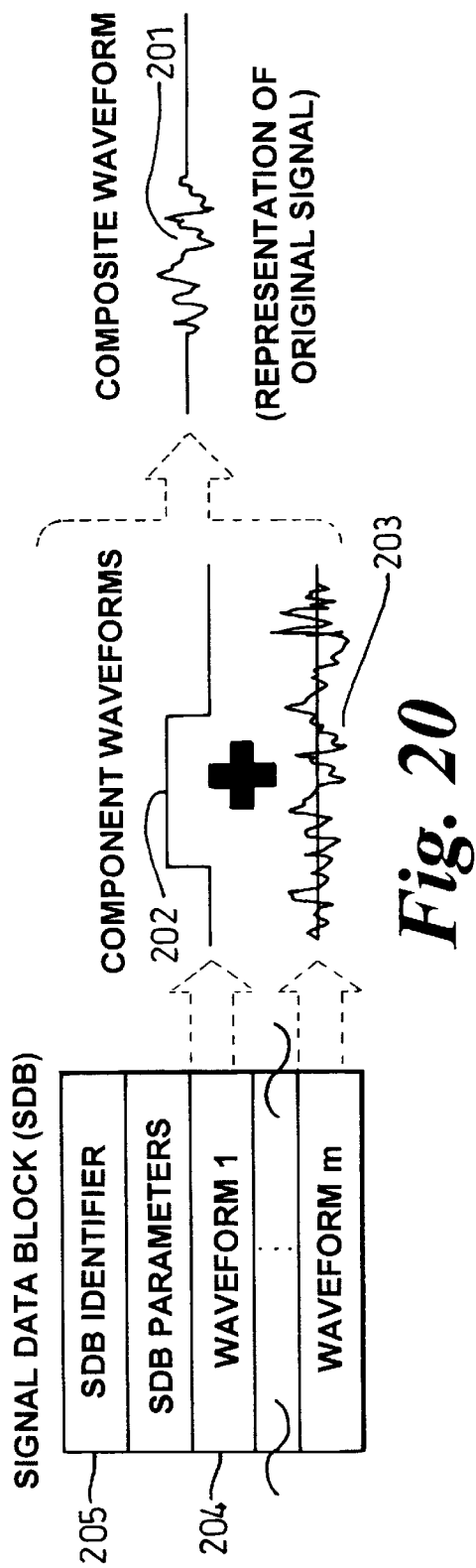
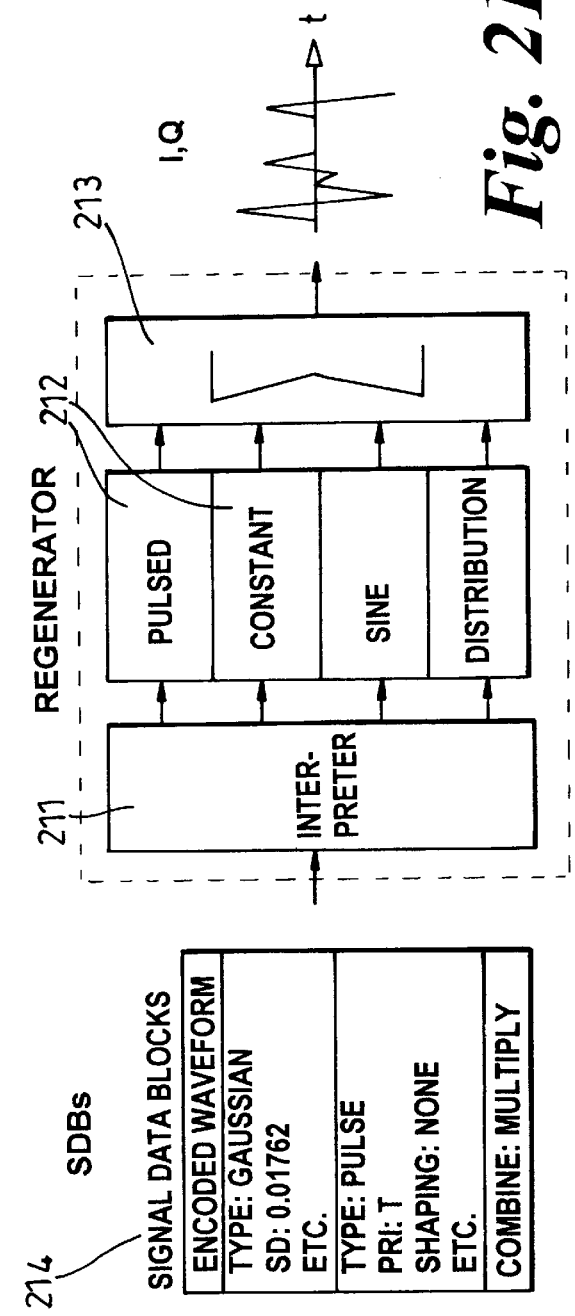

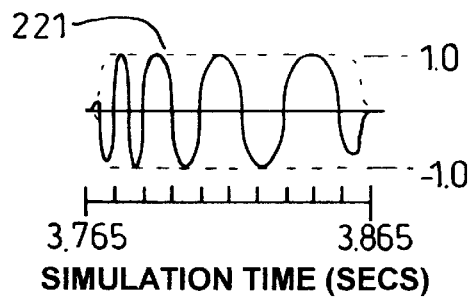

Fig. 22A

| INDEX | DATA | INTERPRETATION |
|---|---|---|
| 0 | 1002 | MULTI-COMPONENT WAVEFORM |
| 1 | 108 | E.G. 27 x 32-BIT FLOATING POINT VALUES = 108 BYTES |
| 2 | 0 | THIS IS THE MAIN SIGNAL ON THE BUS |
| 3 | 2 | SINE TYPE COMPONENT WAVEFORM |
| 4 | 100.0 | FREQUENCY AT START OF TIME PERIOD |
| 5 | 25.0 | FREQUENCY AT END OF TIME PERIOD |
| 6 | 0.0 | PHASE OFFSET AT START OF TIME PERIOD |
| 7 | 0.0 | MEAN LEVEL |
| 8 | 1.0 | PEAK LEVEL |
| 9 | 0 | PHASE ENCODING METHOD |
| 10 | 0 | PHASE ENCODING PARAMETER |
| 11 | 0 | PULSE TYPE COMPONENT WAVEFORM |
| 12 | 3.765 | WAVEFORM START TIME (S) |
| 13 | 0.1 | WAVEFORM DURATION (S) |
| 14 | 2 | MULTIPLY (WITH FIRST COMPONENT) |
| 15 | 0.1 | PERIOD OF WAVEFORM (S) |
| 16 | 0.0 | OFFSET OF PULSE (S) FROM START OF PERIOD |
| 17 | 0.1 | RISE TIME (S) |
| 18 | 0.8 | PULSE LENGTH (S) |
| 19 | 0.1 | FALL TIME (S) |
| 20 | 0.0 | LOW LEVEL (VOLTS) |
| 21 | 1.0 | HIGH LEVEL (VOLTS) |
| 22 | 1 | ROOT RAISED COSINE RISE SHAPING |
| 23 | 1 | ROOT RAISED COSINE FALL SHAPING |
| 24 | 0 | START PHASE 0, I.E. TOATALLY IN THE I PLANE, Q=0 |
| 25 | 0 | NO AMPLITUDE ENCODING |
| 26 | 0 | NO AMPLITUDE ENCODING PARAMETER |

Fig. 22B

METHOD AND APPARATUS FOR MODELLING A SYSTEM WHICH INCLUDES THE TRANSMISSION AND RECEPTION OF SIGNALS

BACKGROUND OF THE INVENTION

1. Field of the Invention

This invention relates to a method and apparatus for modelling a system which includes the transmission and reception of signals and is particularly useful for modelling radio communications systems and radar systems.

2. Description of the Prior Art

Designers of communication systems face a very complex task not only because of the large number of factors or variables involved in the design, but also because performance objectives and cost requirements may conflict. Frequently the designer is faced with an enormous span of possibilities. For example, for a cellular radio network, base station positions must be chosen and other factors such as antenna location, antenna power, antenna direction and frequency allocation chosen. Installation of the infrastructure and equipment for the communications network is typically a very costly and time consuming operation. This places great reliance on the success of the design.

Systems which make use of radar are also subject to the same design problems. Typically the radar sensor designer wishes to propose a configuration which will meet the performance objectives with the minimum cost. The equipment required is typically very expensive to manufacture and install and there is a large number of options involved. For example, choice of configuration (e.g. single beam, multi-beam, mechanical scan, electronic scan, etc.), choice of waveform modulation (e.g. narrowband, wideband, pulsed etc.), choice of operating frequency (e.g. high frequency through centimetric to millimetric) and choice of signal processing method and technology.

To date, communications systems modelling and radar systems modelling has been largely confined to models which have explored variants upon one basic configuration in support of particular system developments (e.g. a model of a specific communications system). Current methods for implementing such models usually satisfy the requirements of the project for which they were created. However, these models typically also suffer a number of significant drawbacks such as:

making little or no re-use of preceding communication system models or parts of these incompatibility with other communication systems models the need to test the entire communication system model from scratch these models are typically difficult to understand and maintain these models are difficult to modify and hence often have only a short lifetime the models are often difficult to use by anyone other than the creator.

A particular problem when modelling mobile telephone communications systems and radar systems is that relationships between components of the system are continually changing and this is difficult and complex to model. For example, in a mobile telephone system, a significant number of mobile telephone subscribers are moving about at any one time. The physical location of the terminals changes. Similarly, in radar systems, the location of a transmit antenna on a ship typically moves and the location of targets, such as aircraft, also move. Any model of these types of systems needs to be able to take into account the movement of components such as terminals and determine how this will affect factors such as the transmission of signals within the system. For example, as a mobile phone user moves into the "shadow" of a building, signals may become harder to receive.

A further problem that occurs when it is required to model systems which include the transmission and reception of a signal is that execution times for the simulations can be very long. This is because, in order to describe fully the signal a large number of samples (above the Nyquist limit) need to be taken from the signal. This large number of samples must then be processed through the various stages of the model which is time consuming, especially when complex calculations are involved. If fewer samples are taken in order to reduce the simulation time there is a reduction in the accuracy of the results.

It is accordingly an object of the present invention to provide a method and apparatus for modelling a system which includes the transmission and reception of signals which overcomes or at least mitigates one or all of the problems noted above.

SUMMARY OF THE INVENTION

According to the present invention there is provided a method of modelling a system which includes the transmission and reception of a signal, said method comprising the steps of:

(i) creating a number of blocks, each block comprising a piece of program code and each block being a representation of an aspect of the system, wherein each block has a pre-defined output; and (ii) forming connections between the blocks, each connection comprising a bus for transferring data between blocks, wherein each bus has the same pre-defined format such that in use blocks can be connected in different configurations without redefining the block outputs.

A corresponding computer system for modelling a system which includes the transmission and reception of a signal comprises:

(i) a memory arranged to store a number of blocks, each block comprising a piece of program code and each block being a representation of an aspect of the system, wherein each block has a pre-defined output;

(ii) connections between the blocks, each connection comprising a bus for transferring data between blocks, wherein each bus has the same pre-defined format such that in use blocks can be connected in different configurations without redefining the block outputs.

In this way a model of a system such as a mobile telephone system can be created and the performance of the system investigated. Various different configurations for the system and different parameter choices can be tested before implementing a chosen system design. This helps to reduce the risk of errors in the implemented system and to improve its efficiency and performance. Implementation costs and times are also reduced. Parts of the resulting model can be re-used for modelling new designs by simply replacing blocks or by connecting the blocks in new ways. Modifications to system components can easily be accommodated by simply updating the relevant blocks. It is not necessary to re-write the whole model from scratch and because of the modular nature of the blocks and the use of "generic" buses the model is easy to understand and maintain. Errors in the model are easy to detect and correct. A further advantage is that information about changes associated with the components can be easily passed between the blocks. For example, if a block represents a mobile telephone and another block represents a base station, information about the current position of the mobile telephone can be passed to the base station. In this way complex situations where relationships between components of the system are continually changing can be modelled.

Advantageously, each bus is of variable size. This enables a bus to operate correctly for situations involving a range of different amounts of data. This makes an efficient use of computer system resources because each bus is able to expand or contract as appropriate to handle the actual quantity of data found on the bus at any given time. The maximum amount of remaining resources are then available for other tasks. Also, large amounts of data can be transferred between pairs of blocks using a single bus connection.

Preferably each bus is arranged to carry data of different types. For example, position information about the location of a base station and radio signal information about transmissions from an antenna. This enables several different types of data to be passed between a pair of blocks using only a single connection comprising a bus. This simplifies the connections between blocks and helps to reduce the number of erroneous or redundant connections that are made.

Preferably the method further comprises the steps of:
(i) representing the signal using a combination of pre-specified waveform types;
(ii) transferring the representation of the signal between blocks using one or more of said buses; and
(iii) regenerating the signal from the representation. This provides the advantage that execution times for the simulations created using the model are reduced. At the same time the accuracy of the simulations is not significantly affected. Parts of the model which it is not required to analyse in detail can be modelled using the compact signal representation to speed up processing. However, other parts of the model can easily be investigated more specifically by using a full, sampled form for the signals. This gives the advantage that both types of modelling can be used at the same time in the same model. Different parts of the model can be examined in detail simply by rearranging the blocks, including the analyser and regenerator blocks in the simulation environment.

The invention also encompasses a method of modelling a system which includes the transmission and reception of a signal, said method comprising the steps of:
(i) representing the signal using a combination of pre-specified waveform types, said waveforms comprising one or more of: a pulse, a sinusoid, a constant, and a distribution. This provides the advantage that a compact representation of the signal can be simply and effectively provided by using only four component waveform types.

BRIEF DESCRIPTION OF THE DRAWINGS

The invention will be further described, by way of example, with reference to the accompanying drawings in which:

FIG. 3b shows a simplified version of FIG. 3a.

FIG. 10 shows selected system parameters.

FIG. 20 illustrates the process of combining component waveforms.

FIG. 21 is a schematic diagram of a regenerator.

FIG. 22a shows a frequency chirp signal with root raised cosine pulse shaping.

FIG. 22b shows a signal data block to represent the waveform of FIG. 22a.

DETAILED DESCRIPTION OF THE INVENTION

Embodiments of the present invention are described below by way of example only. These examples represent the best ways of putting the invention into practice that are currently known to the Applicant although they are not the only ways in which this could be achieved.

Figure 2:
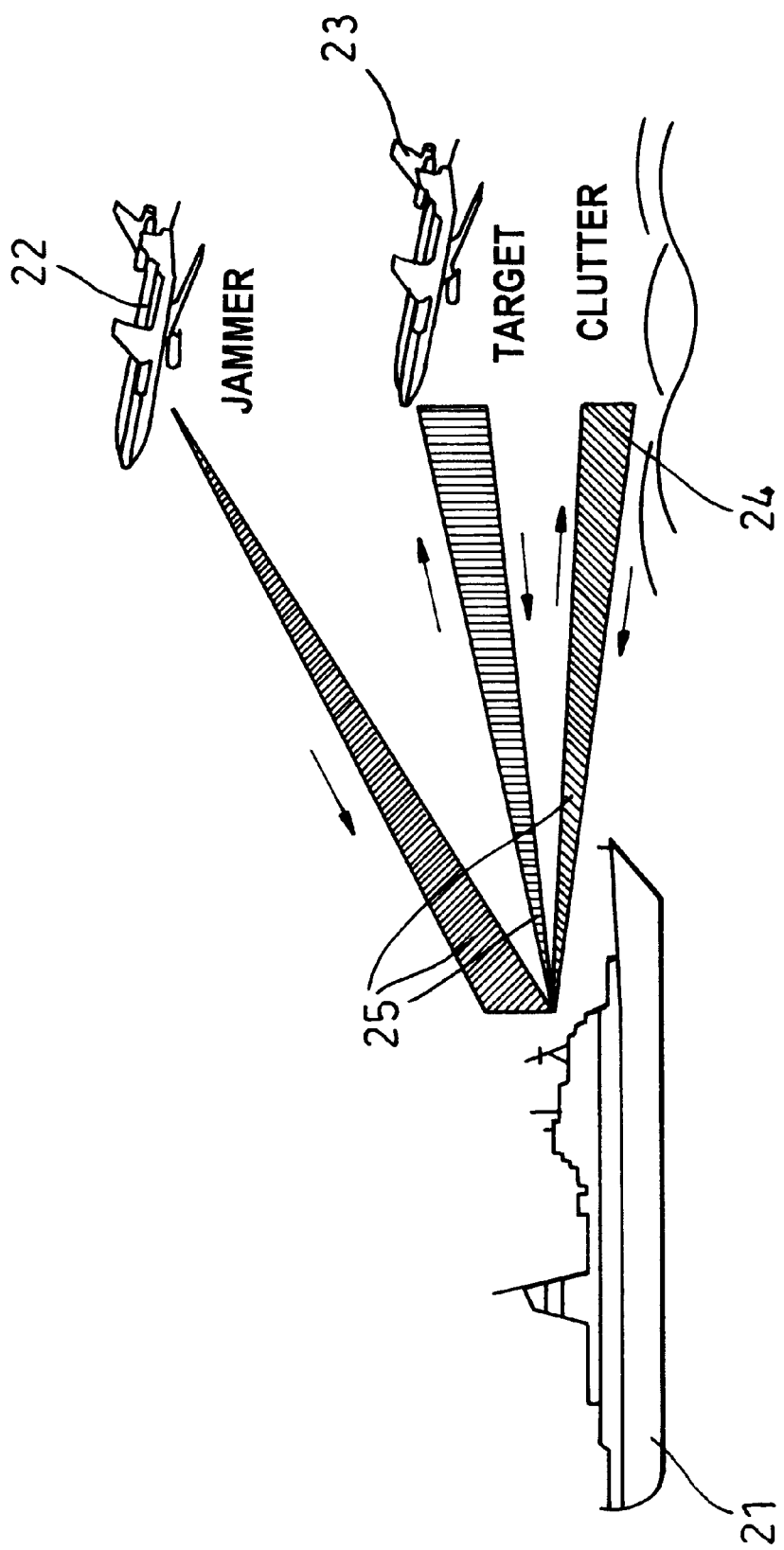
FIG. 2 is a schematic diagram of a radar situation.

FIG. 2 shows a radar situation which is an example of a system which can be modelled using the invention. Radar signals are transmitted from a transmit antenna on a ship 21 in order to detect targets such as the aircraft 23. Radar signals reflected from the target 23 are received by a receive antenna on the ship and used to determine the distance and direction of the target 23. The radar signals reach the target 23 via an air path 25 and may be attenuated according to environmental conditions in the air path. Some of the radar signals are reflected from the surface of the water and form clutter 24 or noise. A jammer signal is also transmitted by a second aircraft 22, seeking to prevent effective radar operation by the ship 21.

Figure 3A:
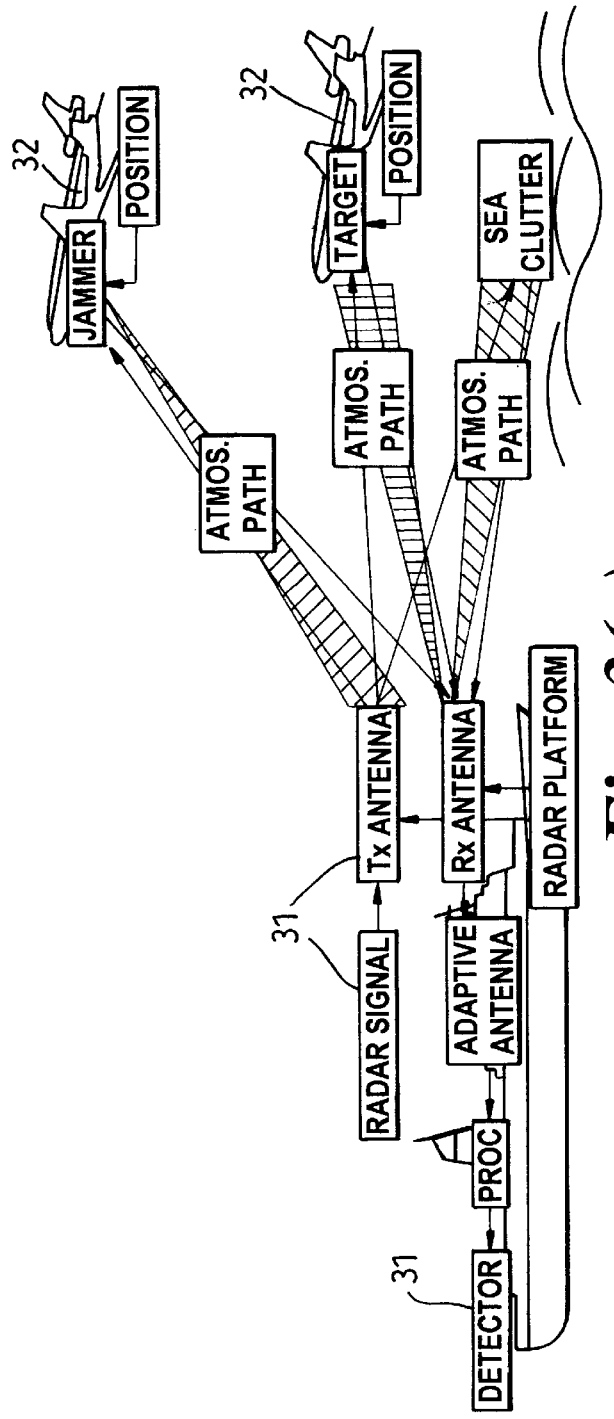
FIG. 3a shows the situation of FIG. 2 represented as a group of interconnected blocks.
Figure 3B:
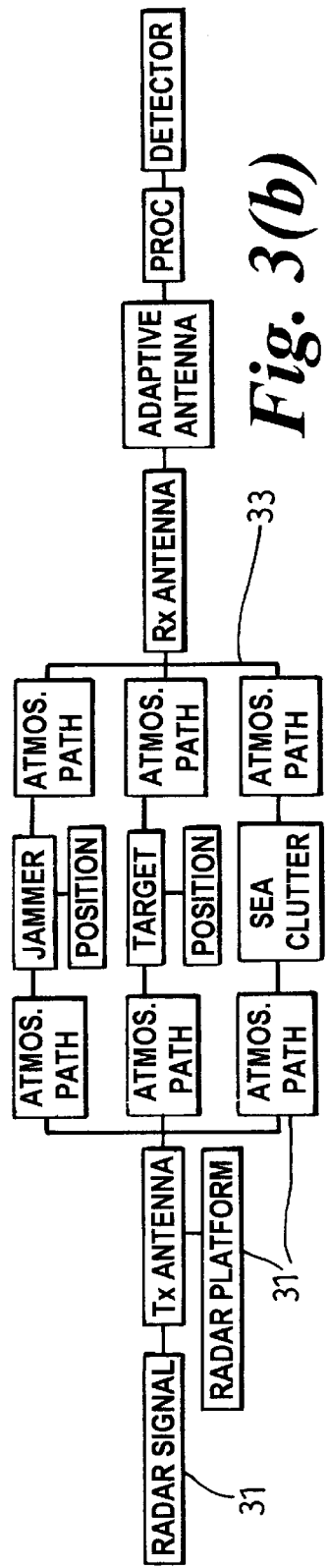
Figure 4:
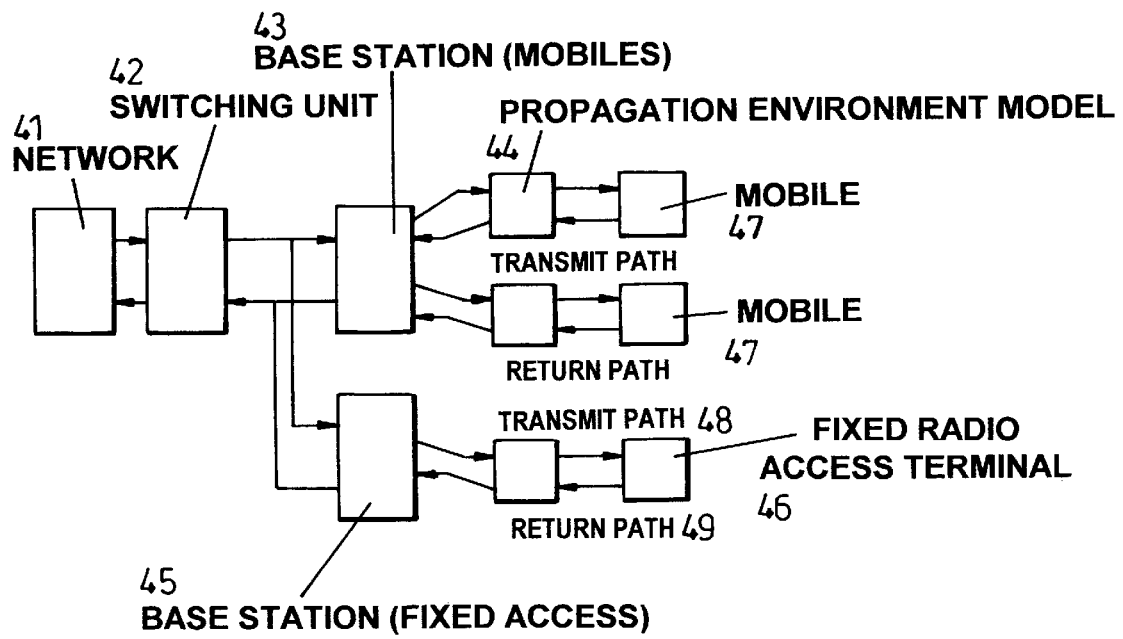
FIG. 4 shows a communications system represented as a group of interconnected blocks.

To model the radar situation shown in FIG. 2 blocks 31,32 are created each representing a component or aspect of the system as shown in FIGS. 3a and 3b. Here blocks 31 represent components of the system such as antennas and air paths. The blocks 31 are connected using buses 33. FIG. 3b shows the arrangement of blocks 31 from FIG. 3a in a simplified way.

Each block 31 comprises a piece of program code designed to accept inputs, process these and produce outputs (or alternatively, generate outputs without receiving inputs). The type and form for the block outputs and inputs (if the block has inputs) are pre-specified. The blocks are designed to represent components or aspects of the system and contain system parameters. For example, a block representing an air path may contain a parameter indicating the weather conditions.

The blocks are designed to be self-contained units that can be "un-plugged" from the model and either replaced with a different block or re-connected in a different way. For example, if it was desired to model the situation shown in FIG. 2, using a helicopter target 23 rather than an aircraft, then the target block could simply be replaced with a block representing a helicopter. This operation is quick and simple to perform and does not require any parts of the model to be re-written. By using encapsulated blocks in this way the method of modelling provides many advantages. The model can easily be updated or adapted to new situations. Also it is easy to locate errors in the model by identifying which block is involved. The models created in this way are conceptually easy to understand and this reduces the time taken to design new systems and so develop new products.

If the blocks are encapsulated or self-contained in this way, there remains the problem of how to share data and information between blocks. Global or shared variables cannot be used, because then the blocks would not be truly modular or self-contained and could not be easily replaced, or connected in different ways. This means that all information required to be passed between blocks must be done during the simulation via the defined inputs and outputs to the blocks. Because of the large amounts of data that need to be transferred and because this data is of different types, a highly complex "wiring" problem results. Connections must be set up to transfer information between blocks with many different types of connections between pairs of blocks. This often leads to errors and is time consuming and difficult. Also, whenever the blocks are rearranged, replaced or removed the "wiring" or connections between the blocks have to be re-created. This is problematic and detracts from the advantage of using modular blocks in the first place.

To explain why information needs to be passed between the blocks, the radar situation shown in FIG. 3 will be considered. Here, even when the blocks have been created to represent aspects of the system, it is still required to take account of changes in the relationships between aspects of the system. For example, the jammer 22, target 23, and ship 21 may all be moving. In order to model, for example, the reflected radar signals from the target 23 it is necessary to know the position of the target. However, the only block in the model which "knows" this information is the target block. In order for this information that is "private" to the target block to be used by the part of the model which simulates the propagation of the signals it must be passed between blocks. Other information that can be transmitted between blocks can include, for example, the speed of a mobile telephone in a vehicle or the transmit power of a mobile telephone at a particular time.

Figure 5:
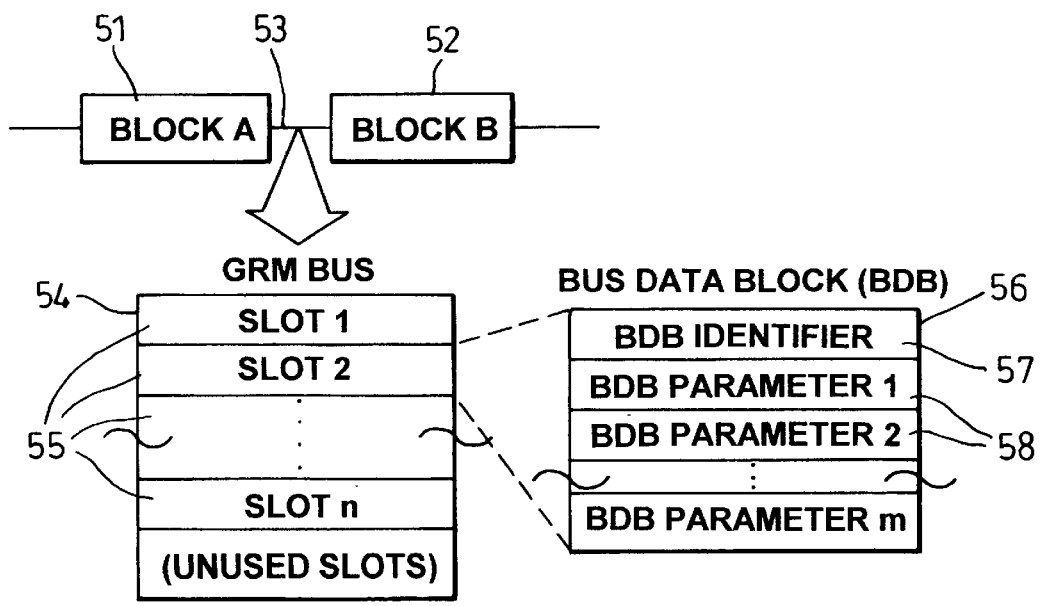
FIG. 5 is a schematic diagram of the structure of a bus.

By using buses 33 to form connections between the blocks 31 the complex wiring problem is removed. (The term bus is used here to refer to a piece of software or program code and not to a piece of hardware.) This makes it easier and simpler to rearrange and replace blocks and connect them together. FIG. 5 shows the structure of a bus 54 that forms a connection 53 between two blocks 51 and 52. The bus is made up of several slots 55 which are each of variable length. The number of slots 55 in the bus is also variable. In this way, each bus has the same pre-defined format or structure, although the contents of each bus may vary. Data from the output of block 51 is inserted into the slots 55 in the bus 51 and carried to the inputs of block 52. Different types of data can be carried in different slots 55 so that it is not required to form many connections between the blocks 51 and 52, one for each type of data. Also, because the slots are of variable length and the number of slots can be expanded or contracted, new connections do not have to be formed to cope with extra data. System resources can also be "freed up" as far as possible by tailoring the bus size to fit the data requirements. It is also possible for the bus to carry data from block 52 to block 51 so that the bus acts as a two-way connection.

Each slot 55 comprises an identifier 56 which indicates the type of data that is being carried in the slot. The data in the slot is held, for example, as parameters 57, 58 in the slot. Together the identifier 56 and the parameters 57,58 are termed a bus data block.

Figure 1:
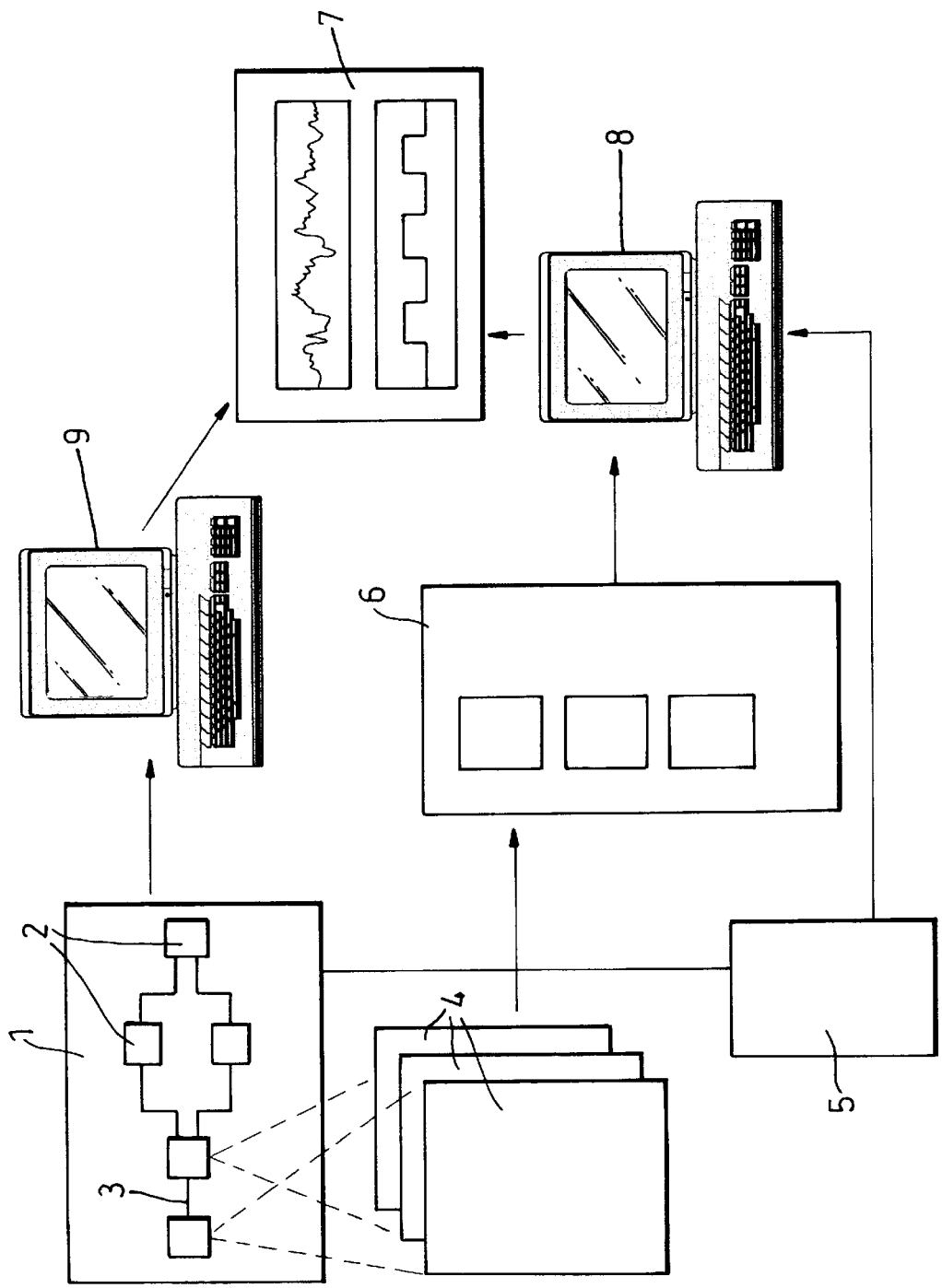
FIG. 1 is a schematic diagram of a modelling system embodying the invention.

The modelling system is designed to be used with a simulation environment and this is described further with reference to FIG. 1. The simulation environment 1 is provided on a computer system which includes an interface, such as a graphical user interface, via which the user can create and adapt a model of a system. The simulation environment is preferably a known tool such as the Signal Processing Worksystem (SPW) from Alta Group of Cadence Design Systems or alternatively it can be a modified version of a known tool. It is also possible to create a simulation environment by writing it from scratch.

Figure 6:
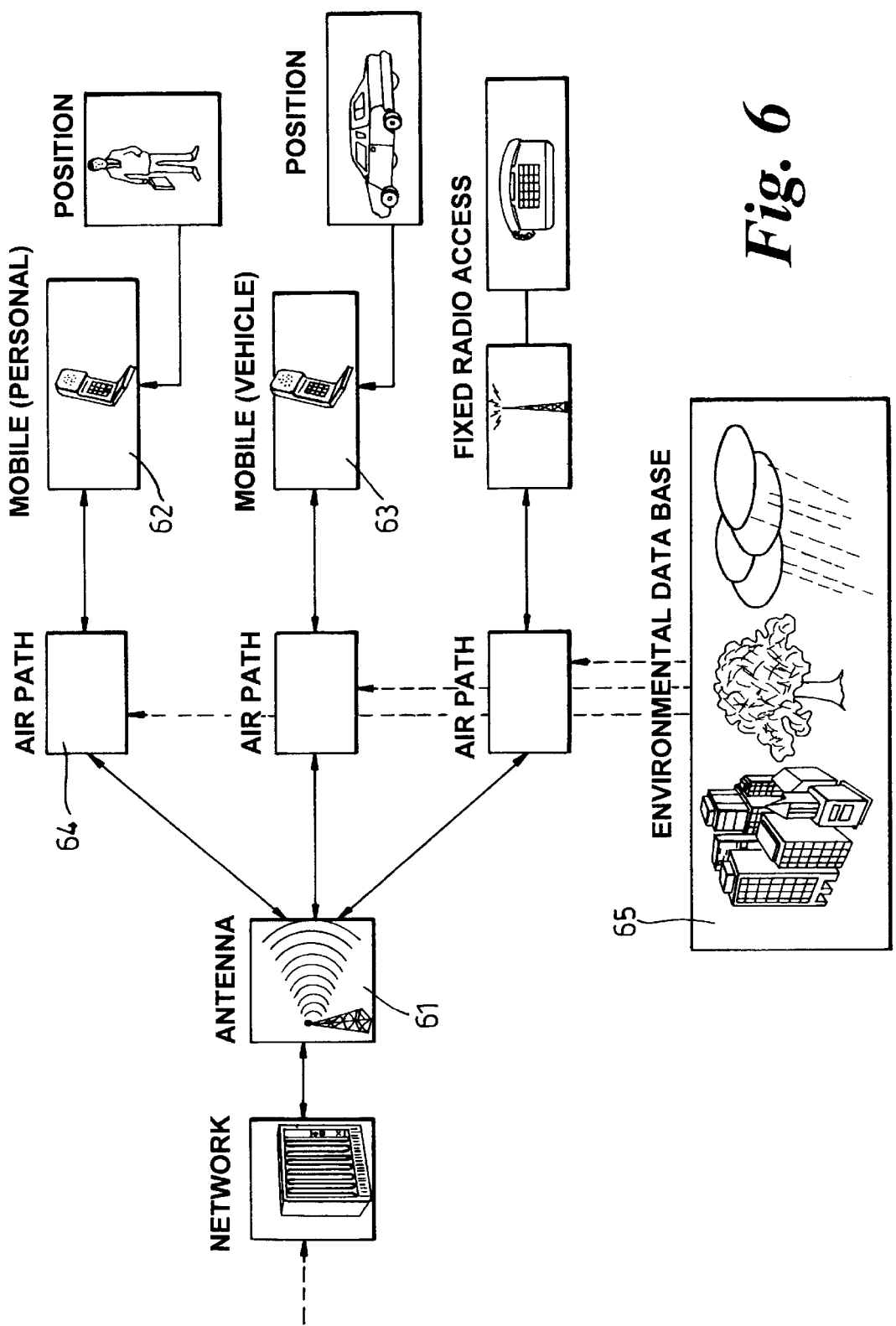
FIG. 6 shows another communications system represented as a group of interconnected blocks.

As already mentioned, aspects of the system to be modelled are represented by blocks 2. For example, if the system to be modelled is a mobile telephone system as shown in FIG. 6, an aspect of the system could be a component such as an antenna 61, a personal mobile telephone 62, a mobile telephone in a vehicle 63 or an air path 64. The term aspect is used to include components of the system such as an antenna and also features of the environment such as air paths, hills, buildings and trees. In this way, the system to be modelled is taken to include the system itself and its environment. The environmental database 65 contains information about such features of the environment. This database can be implemented as part of a library of functions to which blocks have a common access. Alternatively, the environmental information can be held in one or more blocks, or in data file(s). If it is not required to take account of environmental aspects the database 65 can be omitted. For example in a radar situation such as the open sea, environmental conditions could be assumed to be constant.

FIG. 1 shows a simulation environment 1 where the blocks 2 are illustrated as rectangular forms. This is intended to give an idea of how a display, visible to the user, looks when the simulation environment 1 is used. Within the environment blocks can be moved about and rearranged using displays of this type. The simulation environment is preferably designed to provide easy access to the blocks and to enable manipulation and connection of the blocks on the screen. It also acts to hide unnecessary complexity from the user.

"Behind" each block 2 in the simulation environment 1 is a piece of computer program 4 which forms the block. Blocks can also comprise or be made up of other blocks that are connected together. In this way a block can be a hierarchical structure of other blocks that are nested within it. This helps to simplify the process of forming blocks which represent complex aspects of the model. Also, a hierarchy of blocks can be formed by reusing other blocks which saves time and effort as well as reducing the possibility of errors. Complicated blocks can be constructed from more simple blocks and hence complexity can be hidden from the user. At the same time, access to the nested block is available should it be necessary. A block is designed to accept any pre-specified type of data as an input or output. Also, a block is able to use data from other simulations as well as real (i.e. measured) data.

Data files 5 are also provided. These contain system parameters such as the position of a mobile telephone at a given time. The data files 5 are associated with individual blocks so that the blocks are as modular as possible and data is not shared globally.

The model can be written using the programming language C or C++ although any other suitable programming language can be used. The model is designed to be platform independent so that it can be implemented using any type of computer or other processing system. The model is also designed to be independent of any third party development environment.

In constructing new blocks for the modelling system the user preferably makes use of a development environment although this is not essential. Any suitable development environment can be used. Generation of a new block may consist of "plugging together" pregenerated blocks or may be by a "scratch build" method using a basic input form such as C source code or an intermediate form of pseudocode.

In order to use the model the blocks 2 and buses 3 are arranged into the desired configuration, appropriate for the situation to be modelled, and the desired system parameters set up in the data files 5. This is done using the simulation environment 1 and any graphical user interface that is provided. Once the structure of the model has been defined in this way, the pieces of program code from each block 4 and the bus structures 3 are compiled to form a program that is ready to be executed 6. This compilation process can be performed using the development environment. This program is then executed and the outputs of the model obtained. These can then be displayed using a computer 8 as shown at 7 in FIG. 1. Alternatively, the model can be run and the results displayed on a computer screen 9 or other display device, effectively in real time.

Figure 7:
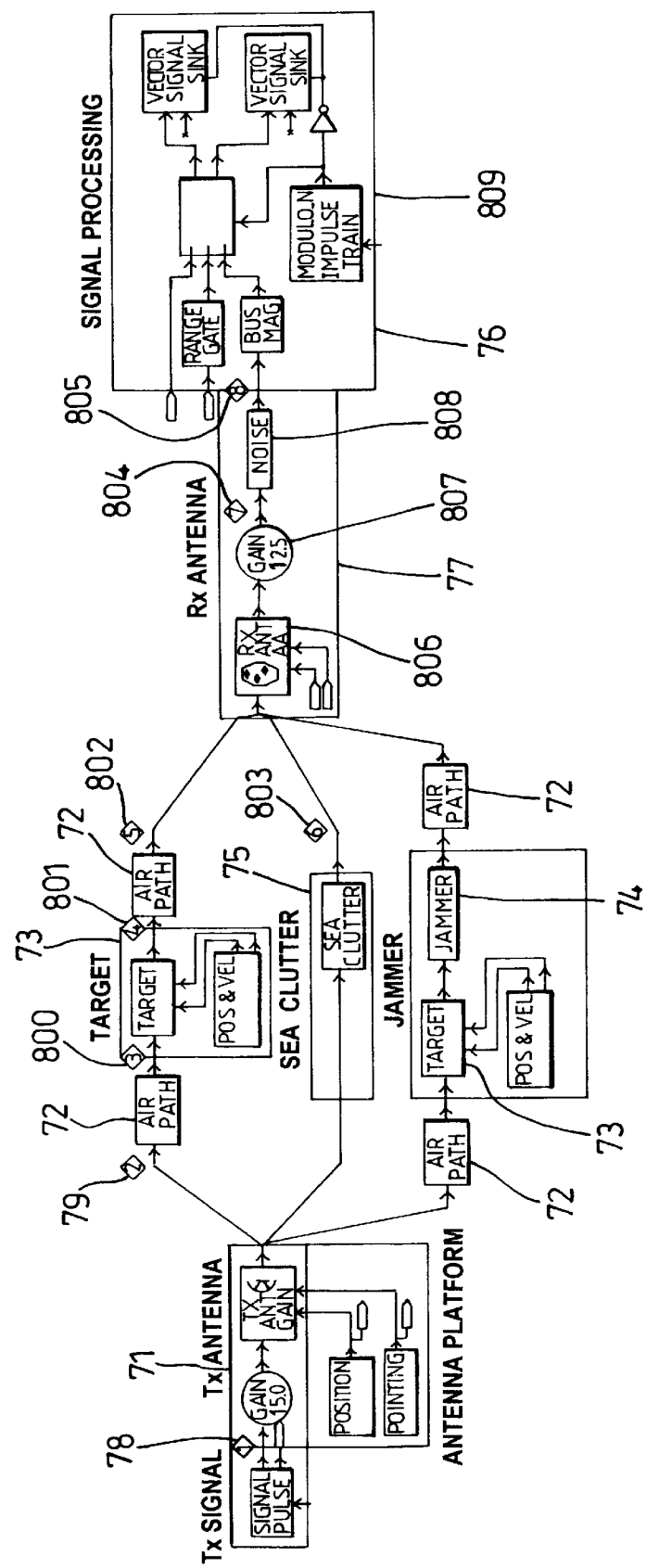
FIG. 7 is an example of a model of a radar system.

An example of using the method to model a radar system is now described. A series of component blocks are first created and verified as far as possible. The blocks are then connected together to form an example radar model as shown in FIG. 7. This format enables the system to be easily comprehended by the user. The model is divided into the following component parts: transmitter 71, air paths 72, sources (targets 73, jammers 74 and clutter 75), signal processing 76 and receiver 77. In order to reconfigure the model by adding a new target, for example, a target block is selected from a library of such blocks and connected between the transmit 71 and receive 77 antennas, with air path blocks 72 on either side of it. Changing the receiver antenna 71 gain or the track of the target 73 is performed simply by altering the data file 5 loaded by the respective block 4 at the start of the simulation. For any meaningful configuration of blocks, the buses connecting the blocks together allow the appropriate data to be passed between the blocks, alleviating the need for the user to alter the neighbouring block inputs and outputs. Using separate transmit 71 and receive 77 antenna blocks allows a bistatic situation (where the transmit and receive antennas are separately located) to be supported as easily as a co-located situation (where the transmit and receive antennas are located in the same place). This latter is the case for the example since the two antennas are connected to the same position and pointing blocks.

In addition, individual blocks are designed to perform a comprehensive set of internal error-checks, including verifying that all input and output connections are of the correct type and that their contents conform to any appropriate standards. It is not essential to include this error checking within blocks although this does help to ensure that the model correctly represents the situation that it is desired to describe. Also, an explanatory warning can be displayed to the user if an error is found and the simulation halted if appropriate.

Figure 8:
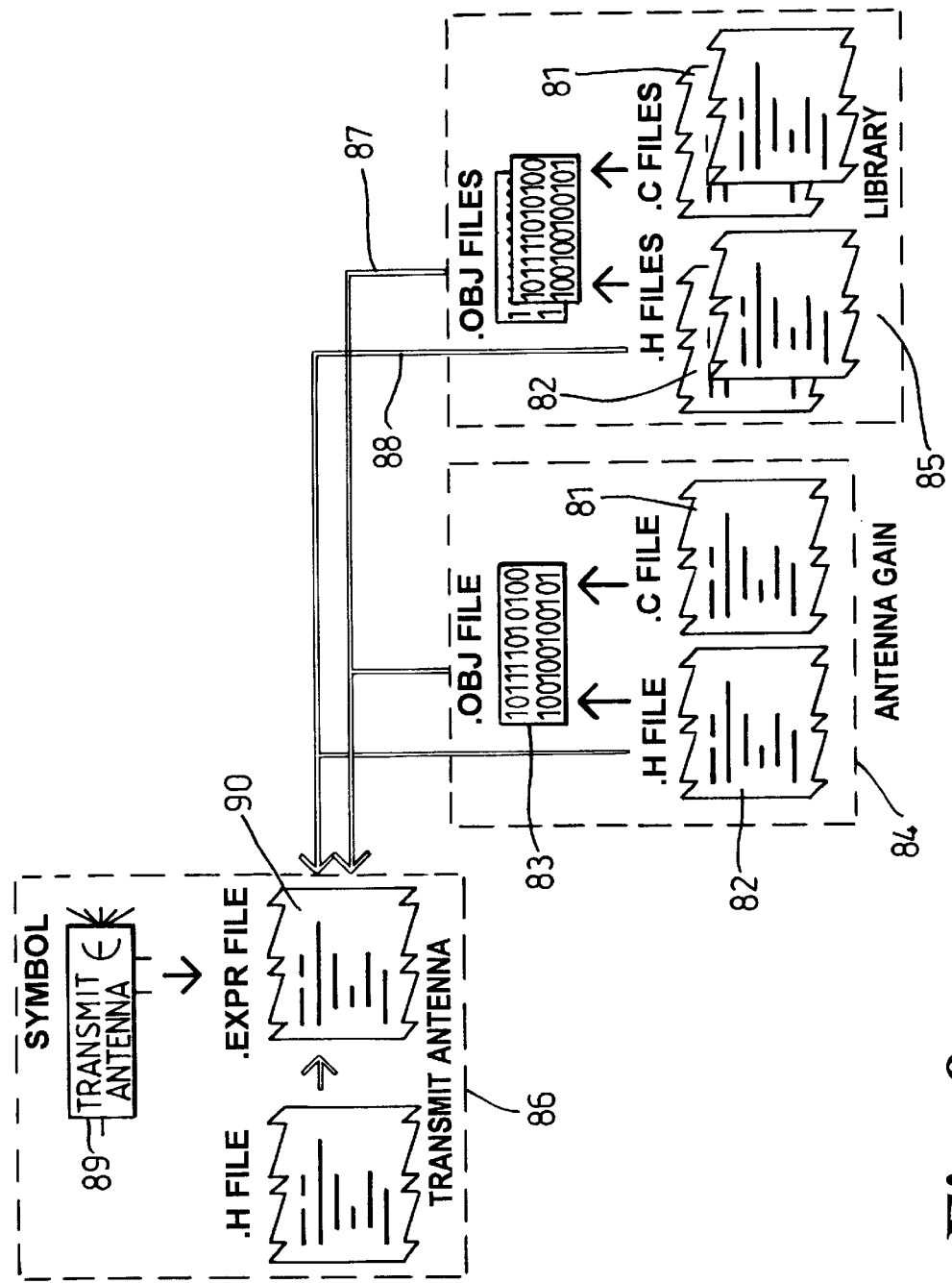
FIG. 8 is a schematic diagram of a transmit antenna block.

The implementation of a particular block is now described as an example. FIG. 8 shows how a block is comprised of source code 81 and object files 83, in this case to form a block representing a transmit antenna 86. In this example the block is implemented within SPW.

Each source code file 81 is considered as a code module which has a header file 82 which contains declarations (of constants, types, structures and function prototypes). These declarations are required by the module itself and by any other modules which wish to call functions within this module.

The term "code module" is generally interchangeable with the term "block". A block may comprise a code module, for example, an antenna gain module which could be used in both a transmit antenna block and a receive antenna block. Both a code module and a block comprise a piece of program code which is intended to model an aspect of the system. A block however has a symbol or other label in the simulation environment which can be used to create different configurations of blocks. A code module does not necessarily have a symbol or label in this way.

The antenna gain calculation is performed by the antenna gain module 84. To prevent the user from tampering (deliberately or accidentally) with this module the source code file 81 is compiled into an object file 83. A library of functions, including the bus access functions, is provided 85. These can be used to form the transmit antenna block 86 as indicated by arrows 87 and 88. These blocks also comprise source code files 81 and header files 82 which are pre-compiled to form object files 83.

A symbol 89 representing the transmit antenna block 86 is provided. This symbol 89 is visible to the user via a graphical user interface and is used to help the user form a certain arrangement of blocks and buses as already described.

The symbol 89 is associated by the simulation environment, in this case SPW, with an expression file 90. An expression file is similar to a source code file 81 but also contains extra code specific to the simulation environment i.e. SPW code. This extra SPW code provides additional definitions and functionality for use by the SPW tool. The SPW code is interpreted by the SPW pre-processor prior to compiling the expression file 90 into the main simulation to create an executable program 6. The expression file 90 references the header files 82 and associated object files 83 of all the modules that it needs. For example, FIG. 8 shows how the expression file 90 references the antenna gain module 84 and modules from the library 85.

The expression file 90 of the transmit antenna block 86 performs all the inputs and outputs that are required for the block to function. This can be done by using some pre-defined blocks from the library 85. In this way a degree of independence is retained from the specific input/output functions used by SPW. Examples of the type of pre-defined functions contained in the library that are used for making the required inputs and outputs to the transmit antenna block are listed below. These include a set of functions to get various parameter values from the bus. There is also a corresponding set of functions to set (or put) parameter values into the bus.

Get antenna polarisation

Get antenna beam width, azimuth

Get antenna beam width, elevation

Get antenna rotation rate

Get antenna X position co-ordinate

Get antenna Y position co-ordinate

Get antenna Z position co-ordinate

Get antenna pointing, azimuth

Get antenna pointing, elevation

Get antenna squint angle (for sequential lobing and conical scan antennas)

Get antenna elevation beam separation angle (monopulse only)

There are corresponding functions to get other types of data from a bus or to set data onto a bus.

Figure 9:
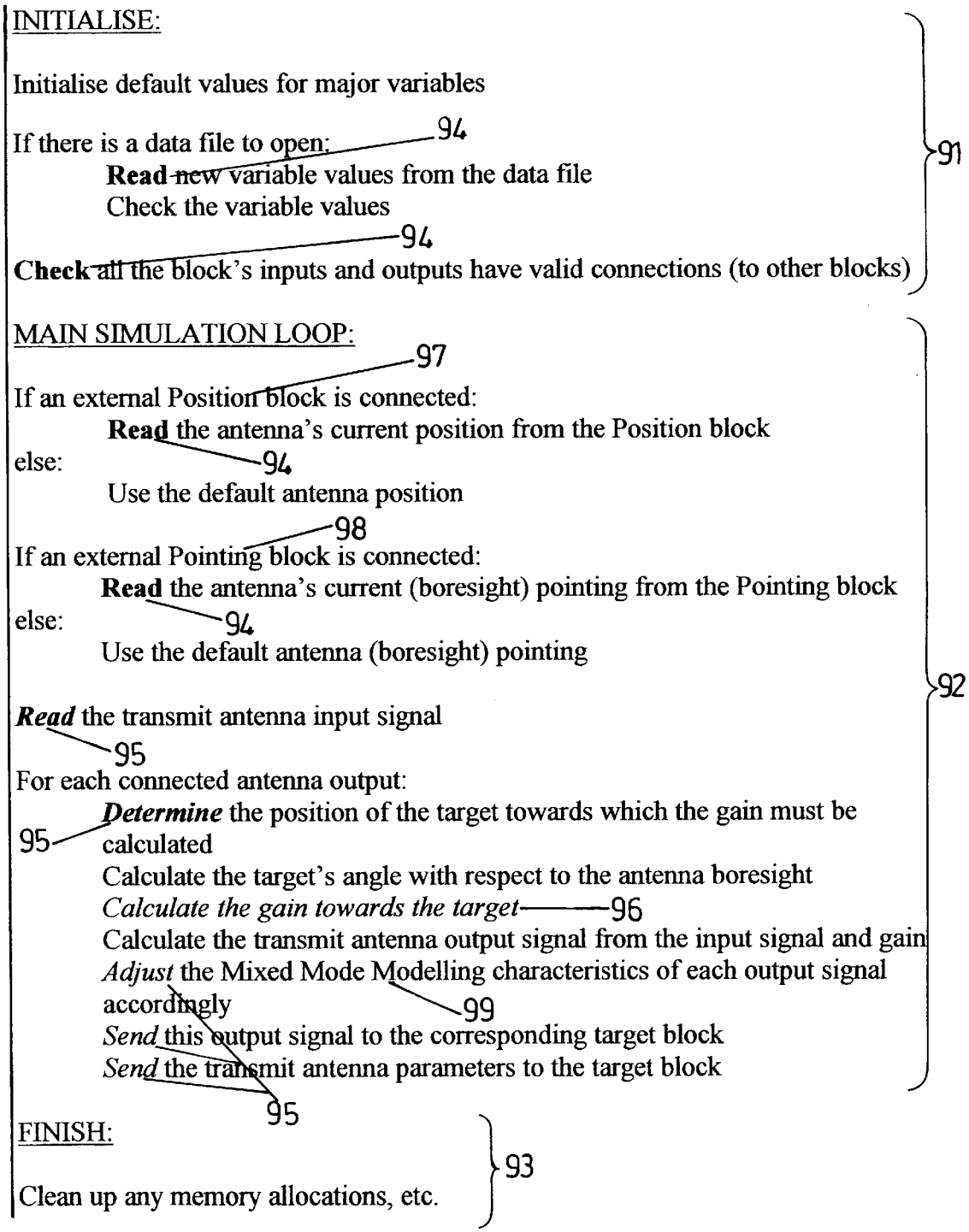
FIG. 9 shows pseudo code for a transmit antenna expression file.

The expression file 90 contains operations, for example as summarised by the pseudo code shown in FIG. 9. This file 90 has an initialisation procedure 91 which is always called before entering the main simulation loop 92. There is also a finish procedure 93 which is called when the simulation ends. Operations shown in bold 94 use commands that are defined in the library 85; and operations shown in bold italics 95, use functions from the library 85 to extract or manipulate data on the bus. Normal italics indicates the single operation 96 to call the antenna gain module 84.

Examples of functions from the library 85 that are used for bus handling operations include:
AddBusSlot
    This adds a given slot to the end of a given bus output.
Inputs: slot type; slot data structure; handle to bus output structure.
Outputs: none
InsertBusSlot
    This inserts a given slot at a given slot position.
Inputs: slot type; slot data structure; handle to bus output structure.
Outputs: none.
CopyBus
    This copies a given input bus structure to a given output bus structure.
Inputs: handle to bus input structure; handle to bus output structure.
Outputs: none.
GetSlotAt
    This gets a handle to a slot structure, at a given slot number.
Inputs: handle to bus inputs structure, slot number.
Outputs: handle to slot structure at given slot number.
GetfirstSlot
    Inputs: handle to bus input structure.
    Outputs: handle to slot structure at next slot; new slot pointer position.

These functions are examples of functions that may be pre-specified or created by the user and stored in the library for use in modifying or creating blocks.

Returning to FIG. 9, in the main simulation loop 92 an external position block 97 and an external pointing block 98 are mentioned. A position block is a generic block for providing the location of an object. The pointing block 98 provides information about the direction of the antenna main beam.

FIG. 9 also contains the term "mixed mode modelling" 99. This term is explained in detail below.

A set of results from the example radar model of FIG. 7 are now described. some of the parameter values that were used in this example are listed in FIG. 10. Here column 101 lists the functions to which the parameters related. Column 102 lists the parameters themselves and column 103 shows the actual parameter values.

Figure 11:
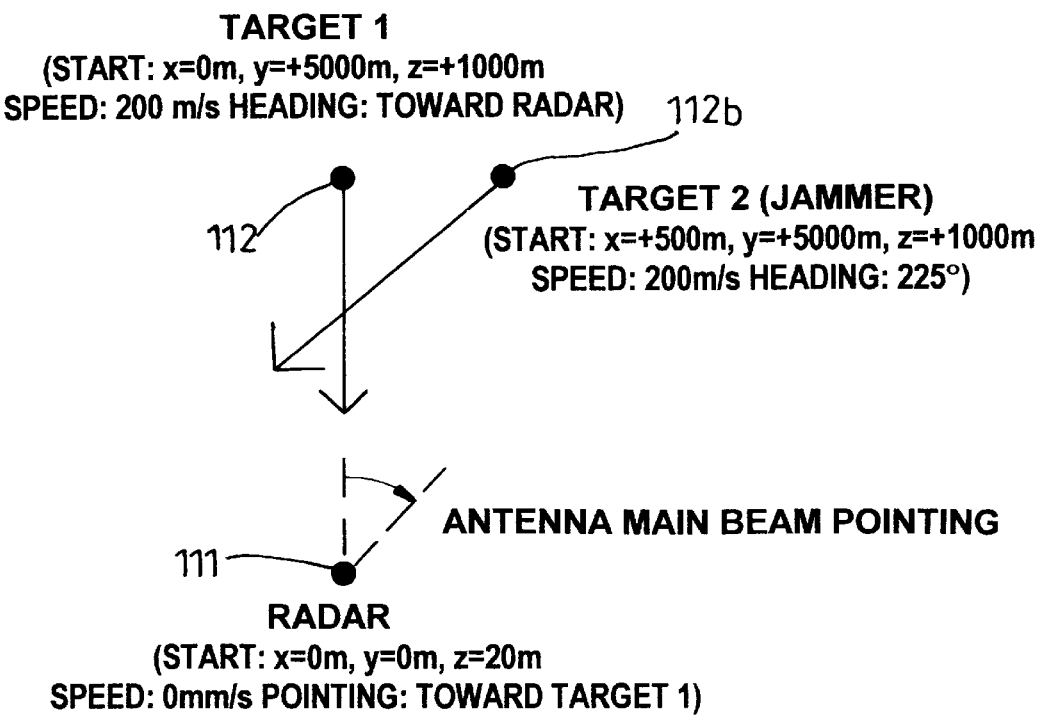
FIG. 11 shows an example radar scenario.

The radar 111 and target 112 positions that were used in this example are shown in FIG. 11.

Figure 12:
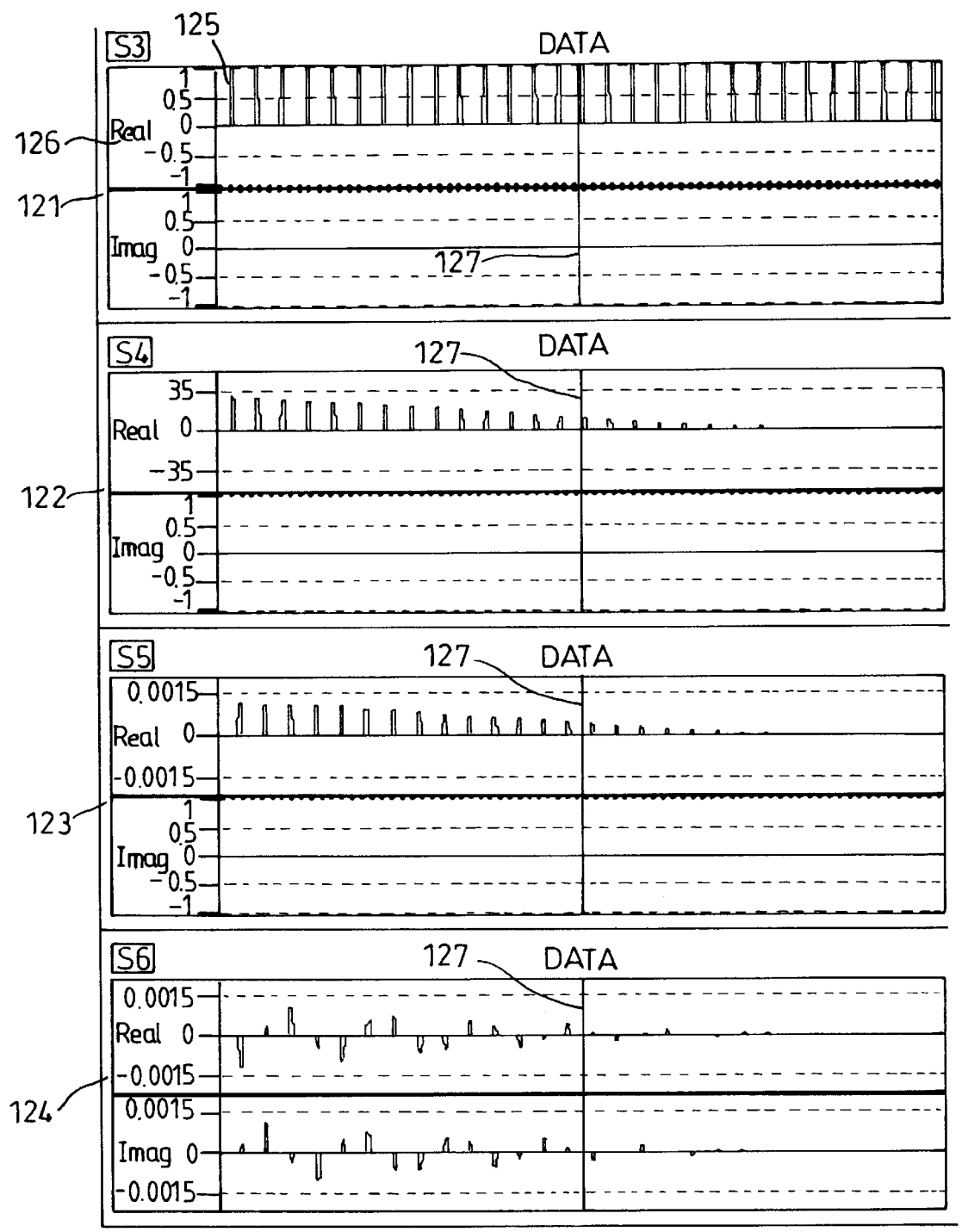
FIG. 12 shows graphs of signal value against time for stages 78, 79, 800 and 801 from FIG. 7.
Figure 13:
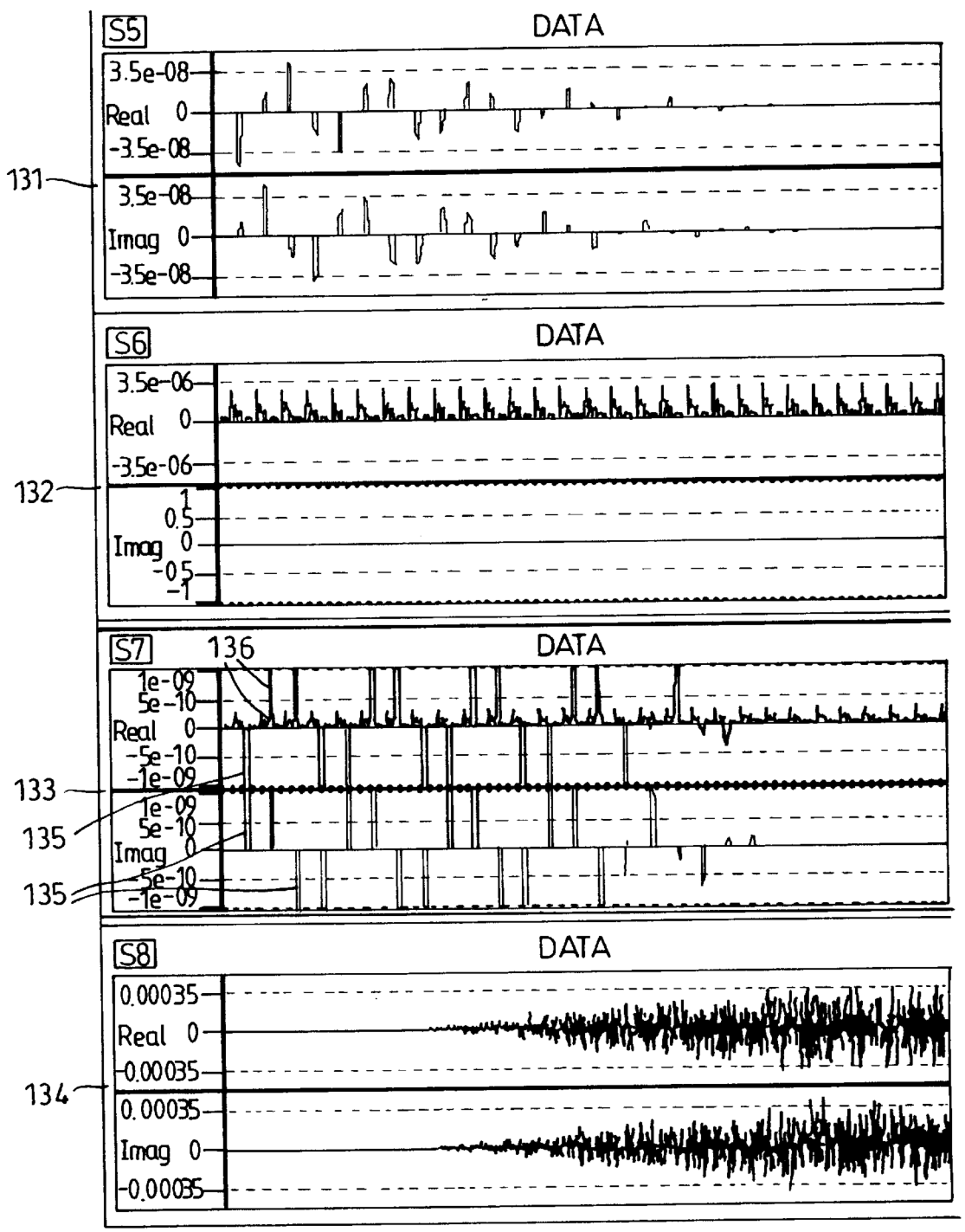
FIG. 13 shows graphs of signal value against time for stages 802, 803 and 804 from FIG. 7.
Figure 14:
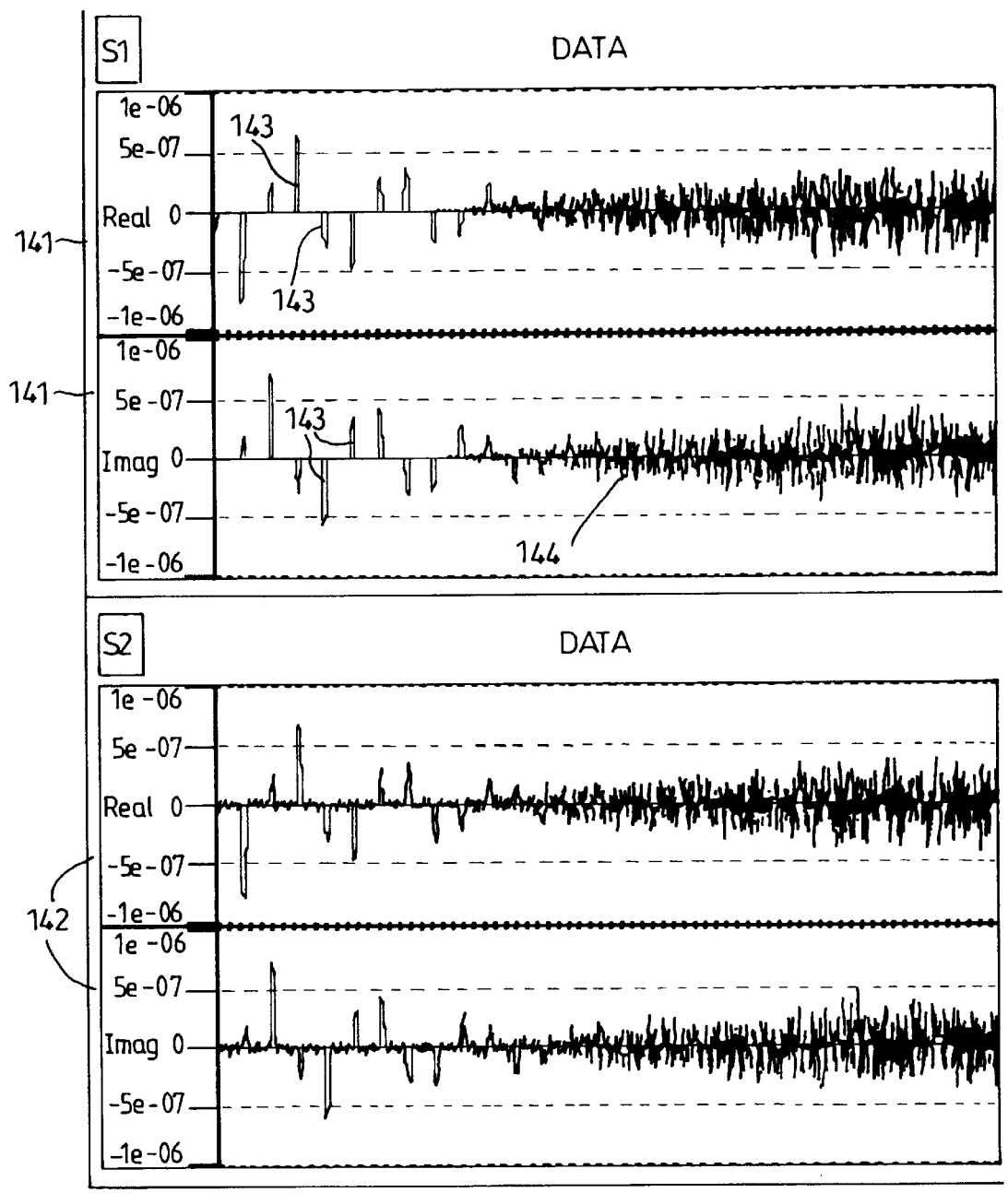
FIG. 14 shows graphs of signal value against time for stages 804 and 805 from FIG. 7.

Radar signals are represented in the model using the known, complex baseband real/imaginary waveform mode. This is a known method for representing signals. This complex baseband mode data can be sampled at a number of stages through the simulation for example, the stages which are indicated using the numerals 78, 79, and 800 to 805 in FIG. 7. An example of samples obtained in this way is shown in FIGS. 12 to 14.

For this example, 1900 samples were obtained at each of the stages so that the first 1.9 ms of a simulations is represented. FIG. 12 shows four graphs 121 to 124. Graph 121 shows samples from stage 78. The x axis represents time and the y axis represents the signal value. Here the radar signal's 15 kHz pulse repetition frequency, 10 micro second pulses are seen as rectangular pulses 125 in the real (I) 126 component. In graph 122 (relating to stage 79) the radar signal has been amplified and passed through the antenna module 71. The gain towards the target is seen to be gradually reducing as simulation time progresses. This is due to the reduction in gain as the antenna beam sweeps round clockwise (see FIG. 11) and the target 112 begins to pass out of the antenna's 111 main beam.

In graph 123, which relates to stage 800 in FIG. 7, the radar signal has been attenuated by the path loss block 72 (which models both range and frequency dependent atmospheric losses). The signal has also been delayed by a number of simulation samples approximating to the propagation delay from the transmit antenna 71 to the target 73. A reference line 127 is shown vertically through each of graphs 121 to 124, which indicates the same point in time for each graph. Using this line it is seen that the pulses in graphs 121 and 122 are aligned in time. However, the pulses in graphs 123 and 124 are delayed with respect to graphs 121 and 122 (to model the propagation delay).

Graph 124 corresponds to stage 801 in FIG. 7. Here the radar signal has been adjusted for the target 112 radar cross section. The signal has also been modulated by the Doppler effect of the target moving toward the antenna giving both real and imaginary components.

FIG. 13 shows the signal relating to stages 802 to 804 in FIG. 7. Graph 131 indicates how the Doppler modulated radar signal is attenuated further by the return air path 72 losses.

Graph 132, which relates to stage 803 in FIG. 7, shows the output of the clutter block 75.

Graph 133 relates to stage 804 in FIG. 7. This shows the sum of all the signals received by the antenna 77. In this example, the jammer 74 and an adaptive antenna 806 in the model have been switched off. The wanted target signal 135 (i.e. no jammer signal is present) is shown amplified (relative to stage 802, graph 131) by the antenna gain pattern 807 and subsequent amplification. It can be seen that the magnitude of the antenna gain pattern decreases as time progresses from left to right. The y axis scale has been increased in graph 133 with respect to graphs 131 and 132. This enables the sea clutter 136 to be clearly visible but also means that the extremes of the wanted signal 135 extend off the top/bottom of the graph.

Graph 134 also represents stage 804 in FIG. 7. Unlike graph 134, the jammer 74 is switched on for this graph. The adaptive antenna 806 is turned off in order to demonstrate the effects of the jammer 74, 112b. It is seen that the jammer signal obliterates the other return signals.

The advantages of an adaptive antenna 806 are demonstrated by enabling the adaptive antenna 806 for the receive antenna 77. Graph 141 in FIG. 14 shows the samples from stage 804. The adaptive antenna reduces the antenna gain towards the jammer 74 so that the jammer is sufficiently attenuated for the wanted signal to be visible. As time progresses from left to right across FIG. 14, the wanted signal 143 is lost as the main antenna 111 beam sweeps past it and round toward the jammer 112b. This gradually brings the jammer 112b into the main antenna 111 beam. The jammer 112b power 144 gradually exceeds that of the signal 143. The start of this degradation can be compared with graph 134 in FIG. 13 (noting the different y axis scaling).

Graph 142 shows the final signal output of the adaptive antenna 806 at stage 805 in the model. At this point receiver noise 808 has been added.

The resulting signal samples can then be analysed using whatever signal processing blocks are desired by the user. FIG. 7 shows signal processing blocks at 809. The results can then be presented for example for a radar situation, as a Constant False Alarm Rate (CFAR) map or a Plan Position Indicator display.

Figure 15:
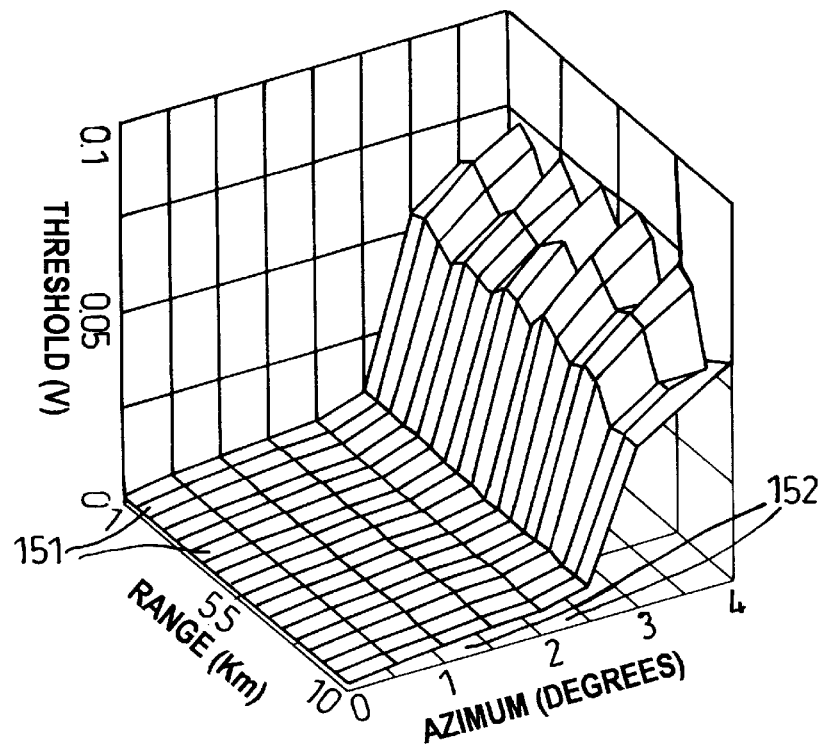
FIG. 15 shows an example of a constant false alarm rate threshold map around target.

FIG. 15 shows an example of a CFAR threshold map around the target 112. The map has 18 range bins 151 covering the range 1 to 10 km and 0.5 degrees wide azimuth bins 152.

Figure 16:
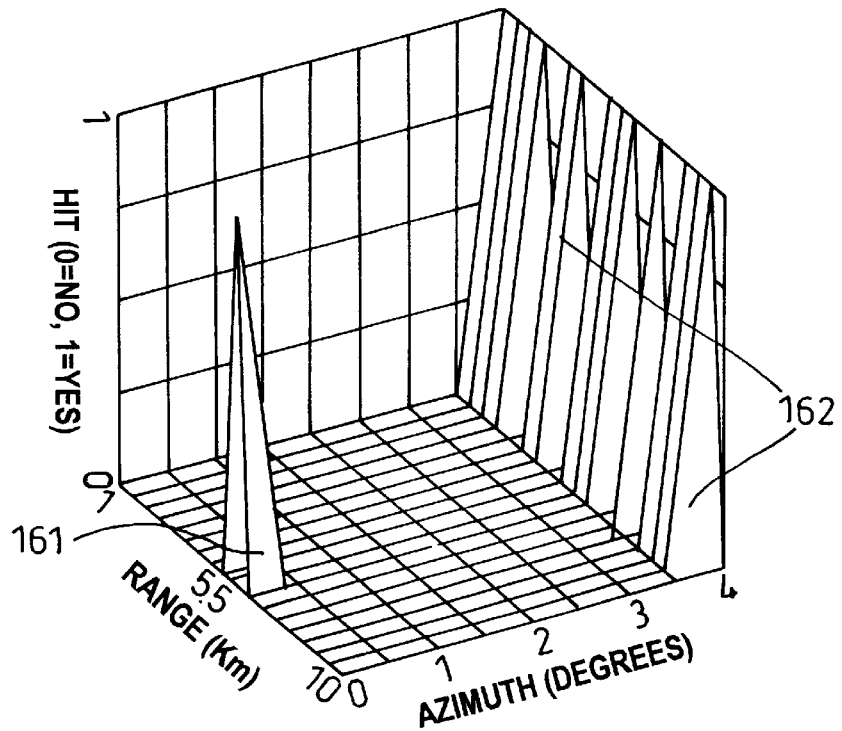
FIG. 16 shows an example of constant false alarm rate target detection.

A resulting "hit" map output is shown in FIG. 16. With the adaptive antenna 806 in operation the target was detected successfully in range bin 9 (4.60 to 5.05 km), see 161 in FIG. 16. However, when the antenna main beam is pointing near the jammer (e.g. at azimuth angel 4 degrees) a large number of false hits 162 occur.

Another aspect of the method of modelling is termed "mixed mode modelling" and this is described further below. Mixed mode modelling seeks to reduce the complexity and execution time of simulations run on the model by allowing parts of a system to be modelled at a simple level using a low sample rate for the signal (e.g. for a radar system, at the radar pulse repetition frequency or lower). At the same time, parts of the system that are of specific interest can be modelled using a full sampling rate for the signal (i.e. above the Nyquist limit).

Figure 17:
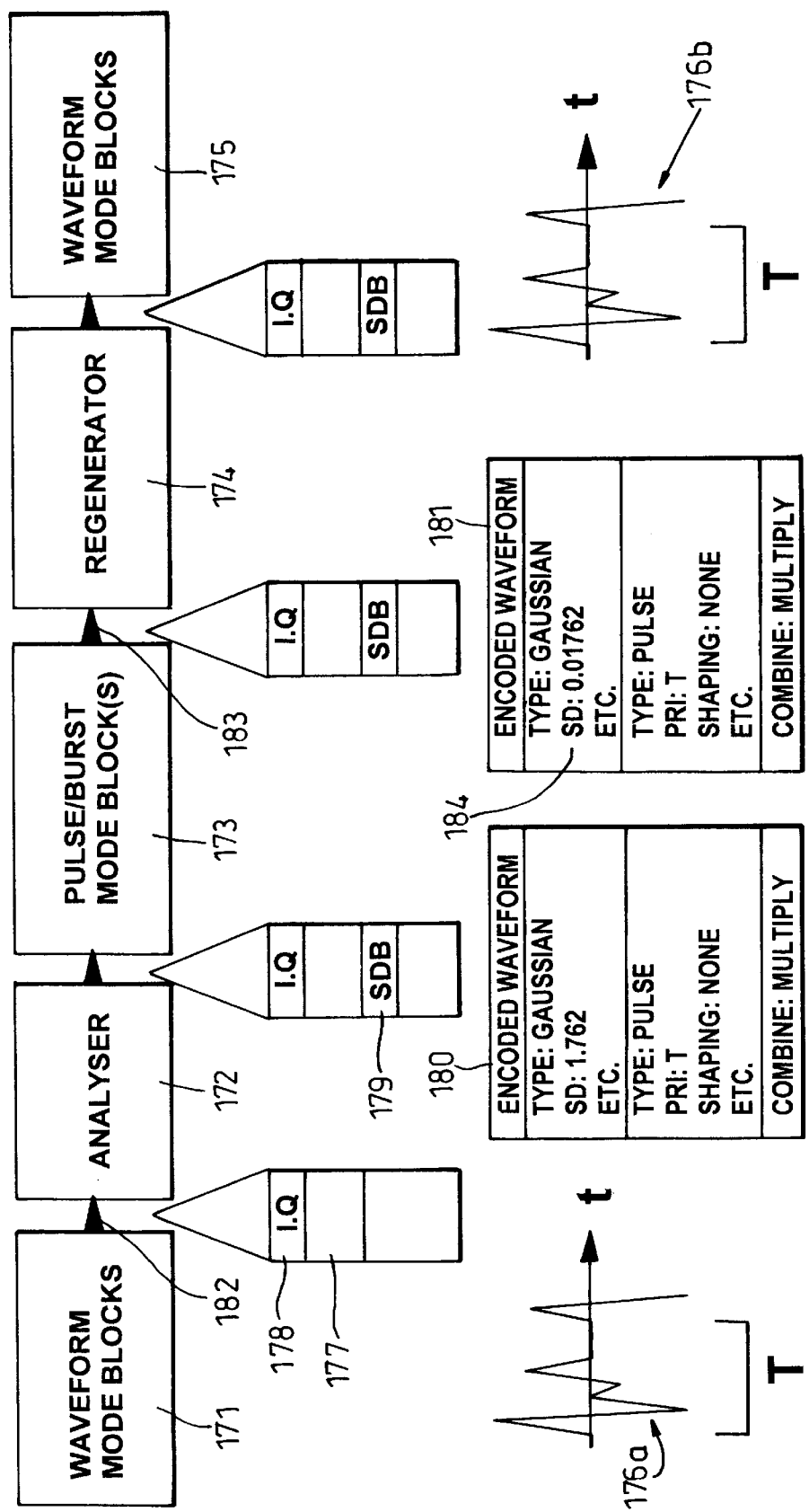
FIG. 17 illustrates the process of mixed mode modelling.

This is illustrated in FIG. 17. A signal to be modelled as passing through a system is represented as 176. The model of the system comprises waveform mode blocks 171 which operate using a full sampling rate for the signal. In this "mode" of modelling the signal samples are carried as individual samples by the bus. For example, a single complex pair of values representing one sample, may be carried between blocks. This is then repeated for each sample that is required. The waveform mode blocks are connected to an analyser 172 using a bus 182. The structure of the bus 182 is represented in more detail at 177 in FIG. 17. The bus contains both a real and imaginary component 178 representing the signal 176. The analyser 172 encodes the signal to form a compact representation of it. An example of an encoded waveform is shown at 180 in FIG. 17. This compact signal representation 180 is stored within dedicated areas on the bus called signal data blocks (SDBs) 179. This is as opposed to bus data blocks (BDBs) which carry system parameters 58 such as target positions, antenna pointings and bandwidths (as well as an identifier 57).

The encoded signal on the bus is then passed between various pulse burst mode blocks 173 in the next part of the model. As the encoded signal is passed between blocks in this way it is modified as a result of processing in the blocks. This processing needs to take account of the encoded form of the signal. For example, table 181 in FIG. 17 shows an encoded form of the signal which is carried on bus 183. Comparison with table 180 shows that the standard deviation 184 of the Gaussian waveform has reduced. This could represent, for example, the power of the signal being attenuated after travelling through an air path. The effects of both linear and non-linear processes upon the encoded signals need to be taken into account.

The modified encoded signal is then passed via bus 183 to a regenerator. This regenerator acts to reform the encoded signal into samples so that the sampling rate is again above the Nyquist limit. The regenerated waveform 176b is then passed between any further waveform mode blocks 175 in the model as required.

Figure 19:
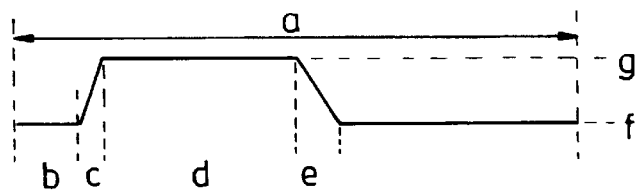
FIG. 19 shows an example of a pulse waveform.
Figure 23:
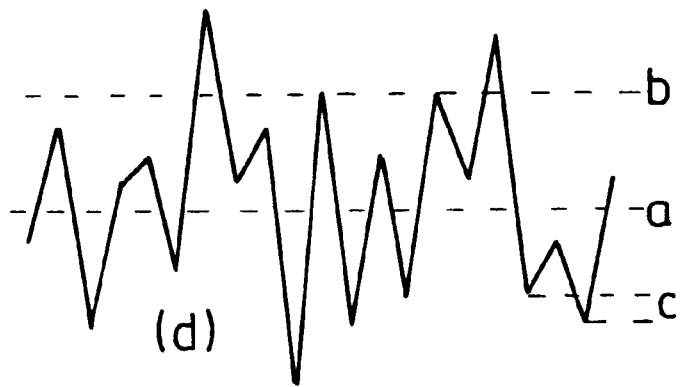
FIG. 23 shows an example of a distribution waveform.
Figure 24:
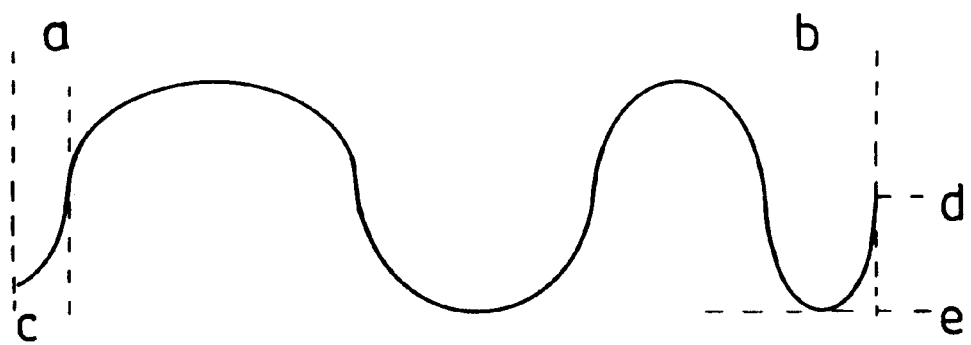
FIG. 24 shows an example of a sinusoidal waveform.

The analyser 172 seeks to model a given segment of the signal (for example, a radar waveform) using a combination of simple component waveform types (with appropriate instructions for combining the components). Preferably the analyser 172 uses only four component waveform types, sinusoidal, constant, pulse and distribution. An example of a pulse waveform is shown in FIG. 19. FIGS. 23 and 24 show a distribution waveform type and a sinusoidal waveform type. However, it is also possible to use less than or more than four component waveform types and to vary the types of component waveform used.

For each component waveform type the analyser 172 also determines a set of waveform parameters, (such as the period of the waveform). It is possible for the user to add further parameters or methods for meeting specific modelling or implementation requirements. These parameters represent the signal characteristics.

Figure 18:
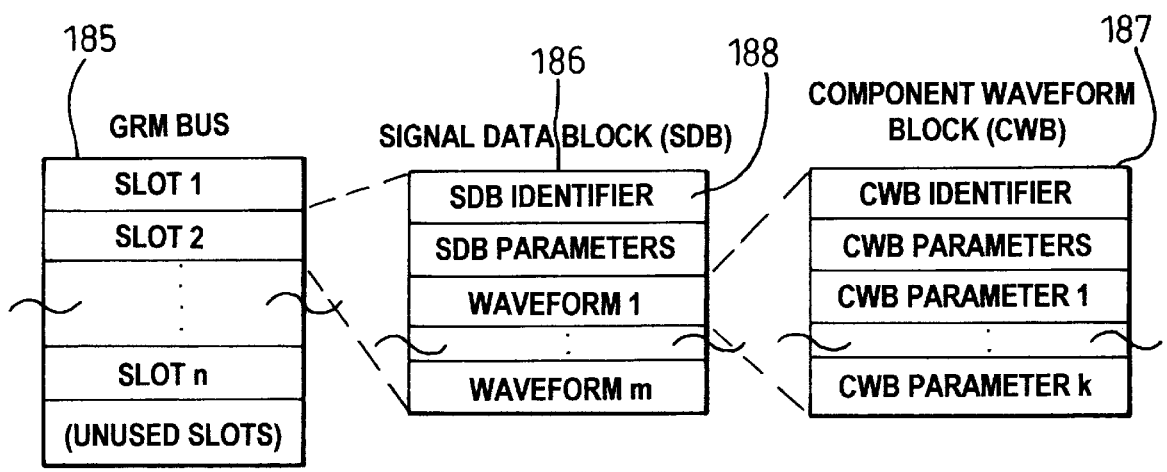
FIG. 18 shows a structure for a signal data block and a structure for a component waveform block.

As already mentioned the compact signal representation is carried within dedicated areas on a bus called signal data blocks (SDBs) 179. An SDB is a specialised type of BDB and is regarded as taking up only one slot on a bus, although an SDB itself is subdivided as shown in FIG. 18.

An individual slot in the bus 185 comprises a signal data block 186. This signal data block comprises a predefined code 188 which indicates that this is a signal data block. The predefined code also indicates the type of SDB. This predefined code is the first value in the SDB. The SDB also contains parameters and information about the component waveforms. Each component waveform is encoded into a subslot or component waveform block (CWB) 187.

To encode waveforms, SDBs containing multiple CWBs are used. These have a structure as shown in the table below:

| Index | Data |
|---|---|
| 0 | Signal data block identifier (code 1002) |
| 1 | Signal data block size |
| 2 | Signal handling code |
| 3...n | Component waveform block 1 |
| n+1...m | Component waveform block 2 |
| m+1...k | Component waveform block m |

The column marked index shows the order of the entries in the CWB. For example, index 0 is for the first entry which is always an SDB identifier code. After the fixed value identifier (in the example above this is 1002), the value at index 1 indicates the size (in host base memory units) of the SDB. The next entry is the signal handling code indicating how the signal represented by this SDB should be combined with any preceding SDBs on the same bus. Examples of combination codes are given in the table below:

| Code | Combination method |
|---|---|
| 0 | no effect |
| 1 | Add (this component waveform to the current composite waveform) |
| 2 | Multiply (this component waveform with the current composite waveform) |
| 3 | Mix (multiply this component waveform with the current composite waveform) |
| 4 | Upper limit (this component waveform should be used as an upper limit to the current composite waveform, i.e. simulating clipping) |
| 5 | Lower limit (as code 4 but used as a lower limit) |
| 6 | Clip (as code 4 but used as an upper limit to the magnitude of the current composite waveform) |
| 7+ | reserved |

Subsequent parameters are CWBs with the format shown in the table below:

| Index | Data |
|---|---|
| k | Component waveform type (CWT) |
| k+1 | Start time |
| k+2 | Duration |
| k+3 | signal handing code |
| k+4...k+n | parameters |

The four possible component waveform types include pulsed, constant (i.e. constant level), sinusoidal or distribution. CWT codes 4 and above are preferably reserved for user defined waveforms. These are intended to be used for special waveforms which cannot efficiently be represented by combining the given component waveform types. However, it is not essential to include these.

An example of a pulsed waveform is shown in FIG. 19. This figure shows seven waveform parameters labelled a to g which are used to allow the representation of many different waveforms. Examples of possible waveform parameters for such a pulsed waveform are given below:

| Code | Offset | Data |
|---|---|---|
| a | 0 | waveform period |
| b | 1 | offset of start of pulse from start of period |
| c | 2 | rise time |
| d | 3 | pulse length |
| e | 4 | fail time |
| f | 5 | low level |
| g | 6 | high level |
| — | 7 | rise shaping code |
| — | 8 | fall shaping code |
| — | 9 | starting phase |
| — | 10 | Pulse amplitude encoding method |
| — | 11 | pulse encoding parameter |

The column of this table labelled offsets refers to the position of the parameter value relative to the start of the variable parameter section in a CWB.

This set of parameters allows the representation of many different waveforms. For example, rectangular (c=e=0), triangular (d=0), saw-tooth (d=0, e=0), step function (a=infinity), or even a constant value (f=g).

A starting phase parameter can be included as shown. For example this is required when the output waveform is complex. In the case of a pulse signal originally in the real plane, if this is modulated by Doppler it will have both real and imaginary components.

The rise/fall shaping code indicates any shaping function applied to the rise and fall periods.

The analyser 172 seeks to model a given segment of the signal using a combination of component waveforms together with instructions about how to combine these in order to recreate the "fully" sampled signal. FIG. 20 illustrates how the component waveforms can be combined in order to represent a wide variety of more complex signals.

Combination of component waveforms is performed by placing multiple CWBs within an SDB. Each CWB has a signal handling (or effect) code which defines how it is to be combined with its companions. Any block wishing to regenerate the signal then has to combine all the listed component waveforms to create the desired composite waveform. A simple example of a pulsed noise waveform 201 (from a pulse 202 and distribution 203 component waveforms) is shown in FIG. 20.

The first CWB 204 in the SDB 205 is used as the basis for the waveform. The first CWB is combined with this waveform according to its signal handling code. The next CWB is combined with the results of the first combination, and so on until all the CWBs have been combined. The CWBs should be combined in simulation "chronological" order; new CWBs should be added to the end of the SDB as it passes through a block.

The regenerator 174 takes a compact signal representation from a bus and regenerates a time-sampled complex base band waveform from it. The regeneration process is now described. Many features of this process are applied "in reverse" for the process whereby the compact representations are generated.

The regenerator 174 is a stand alone block which comprises several component parts as shown in FIG. 21. These include an interpreter 211, waveform generators (one for each component waveform type 212), and a combiner 213. The interpreter 211 extracts an SDB 214 from the bus (or perhaps is simply passed the SDB alone), and extracts each of the CWBs. Depending upon the component waveform type for each CWB, the CWB parameters are passed to the appropriate waveform generator 212 and the output of all the generators are combined according to their individual signal handling (or effect) codes by the combiner 213.

Because multiple CWBs may be of the same component waveform type, each waveform generator 212 within the regenerator 174, is able to output multiple waveforms in the order required for correct combination of the waveforms. This order is defined by the signal handling codes.

An example of a multiple CWB waveform and how it is represented is given in FIG. 22. The table 222 shows an SDB used to represent the waveform 221. The waveform 221 is modelled as having an envelope which is a pulsed waveform. This is represented using parameters 223 in the SDB. The pulsed waveform has a root raised cosine shaping of the rise and fall periods (see parameters 225 and 226).

The pulsed waveform envelope is considered as being multiplied with a sinusoid to model the waveform 221. The sinusoid waveform component is represented by parameters 224 in the SDB and has differing start 227 and end 228 frequencies. In this way a frequency modulated "chirp" signal 221 can be modelled.

A range of applications are within the scope of the invention. These include situations in which it is required to model systems that include the transmission and reception of a signal. For example, commercial air traffic systems, air defence systems, sonar systems, radar systems, mobile telephone systems and other communications systems.

What is claimed is:

1. A method of modelling a system which includes the transmission and reception of a signal, said method comprising the steps of:

(i) creating a number of blocks, each block comprising a piece of program code and each block being a representation of an aspect of the system, wherein each block has at least one of a pre-defined input and a pre-defined output;

(ii) forming connections between the blocks, each connection comprising a bus for transferring data between blocks, wherein each bus comprises a number of slots, each slot comprising data and an identifier of the type of data carried in the slot, and wherein the bus has the same pre-defined format such that in use blocks can be connected in different configurations without redefining the inputs and outputs of blocks; and (iii) using the resulting blocks end connections to model the system.

2. A method as claimed in claim 1 wherein each bus is of variable size.

3. A method as claimed in claim 1 wherein each bus is adapted to carry a number of different types of data.

4. A method as claimed in claim 3 wherein each slot further comprises a number of system parameters.

5. A method as claimed in claim 1 wherein each bus comprises a variable number of slots for carrying data.

6. A method as claimed in claim 1 wherein each slot is of variable length.

7. A method as claimed in claim 1 wherein at least one block is comprised of a number of other blocks.

8. A method as claimed in claim 1 wherein a block comprises one or more predetermined system parameters.

9. A method as claimed in claim 1 wherein the system comprises a radar system.

10. A method as claimed in claim 1 wherein said signals are radio signals.

11. A method as claimed in claim 1 wherein the system comprises a communications system.

12. A method as claimed in claim 1 which further comprises the steps of:

(i) representing the signal using a combination of pre-specified waveforms;

(ii) transferring the representation of the signal between blocks using one or more of said buses; and (iii) regenerating the signal from the representation.

13. A method as claimed in claim 12 wherein the pre-specified waveform types comprise a pulse, a sinusoid, a constant and a distribution.

14. A method as claimed in claim 1 wherein the data comprises a representation of a signal.

15. A method as claimed in claim 1 wherein the data comprises simulation or modelling parameters.

16. A computer system for modelling a system which includes the transmission and reception of a signal comprising:

(i) a memory arranged to store a number of blocks, each block comprising a piece of program code, and each block being a representation of an aspect of the system, wherein each block has at least one of a pre-defined input and a pre-defined output;

(ii) connections between the blocks, each connection comprising a bus for transferring data between blocks, wherein each bus comprises a number of slots, each slot comprising data and an identifier of the type of data carried in the slot and wherein the bus has the same pre-defined format such that in use blocks can be connected in different configurations without redefining the inputs and outputs of the blocks.

17. A computer system as claimed in claim 16 which further comprises:

(i) an analyser arranged t o represent the signal using a combination of pre-specified waveform types;

(ii) a regenerator arranged to regenerate the signal from the representation; and wherein one of more of said buses are arranged to transfer the representation of the signal between blocks.

18. A method of modelling a system which includes the transmission and reception of a time sampled signal, said method comprising the steps of:

(i) representing the signal using a combination of pre-specified waveform types, said signal being encoded to form a compact representation of it, said waveform types comprising one or more of: a pulse, a sinusoid, a constant, and a distribution;

(ii) transferring the representation of the signal between blocks, said blocks comprising a piece of program code and each block being a representation of an aspect of the system; and (iii) regenerating the time sampled signal from the representation.

* * * * *